(12) United States Patent
Violette

(10) Patent No.: US 8,049,298 B2
(45) Date of Patent: *Nov. 1, 2011

(54) ISOLATION TRENCHES FOR MEMORY DEVICES

(75) Inventor: Michael Violette, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 12/891,248

(22) Filed: Sep. 27, 2010

(65) Prior Publication Data

US 2011/0012186 A1 Jan. 20, 2011

Related U.S. Application Data

(60) Division of application No. 11/962,967, filed on Dec. 21, 2007, now Pat. No. 7,892,943, which is a continuation of application No. 10/878,805, filed on Jun. 28, 2004, now Pat. No. 7,332,408.

(51) Int. Cl.
*H01L 29/00* (2006.01)

(52) U.S. Cl. ........ 257/510; 257/314; 257/315; 257/316; 257/317; 257/318; 257/E27.078; 257/E29.309

(58) Field of Classification Search ......... 257/314–318, 257/510, E27.078, E29.309
See application file for complete search history.

(56) References Cited

U.S. PATENT DOCUMENTS

| | | | |
|---|---|---|---|
| 6,265,281 B1 | 7/2001 | Reinberg | |
| 6,322,634 B1 | 11/2001 | Pan | |
| 6,437,417 B1 | 8/2002 | Gilton | |
| 6,566,229 B2 | 5/2003 | Hong | |
| 6,596,607 B2 | 7/2003 | Ahn | |
| 6,627,529 B2 | 9/2003 | Ireland | |
| 6,693,050 B1 | 2/2004 | Cui | |
| 6,756,654 B2 | 6/2004 | Heo et al. | |
| 6,780,721 B2 | 8/2004 | Farrar | |
| 6,897,120 B2 | 5/2005 | Trapp | |
| 7,033,909 B2 | 4/2006 | Kim et al. | |
| 7,105,397 B2 | 9/2006 | Hieda et al. | |
| 7,208,812 B2 | 4/2007 | Ohta | |
| 2002/0072198 A1 | 6/2002 | Ahn | |

(Continued)

FOREIGN PATENT DOCUMENTS

JP 2002-208629 7/2002

OTHER PUBLICATIONS

S.H. Shin, et al., "Data Retention Time and Electrical Characteristics of Cell Transfer According to STI Materials in 90 nm DRAM," Journal of Semiconductor Technology and Science, vol. 3, No. 2, Jun. 2003, pp. 69-75.

(Continued)

*Primary Examiner* — Samuel Gebremariam
(74) *Attorney, Agent, or Firm* — Leffert Jay & Polglaze, P.A.

(57) ABSTRACT

A first dielectric plug is formed in a portion of a trench that extends into a substrate of a memory device so that an upper surface of the first dielectric plug is recessed below an upper surface of the substrate. The first dielectric plug has a layer of a first dielectric material and a layer of a second dielectric material formed on the layer of the first dielectric material. A second dielectric plug of a third dielectric material is formed on the upper surface of the first dielectric plug.

11 Claims, 5 Drawing Sheets

U.S. PATENT DOCUMENTS

| | | |
|---|---|---|
| 2002/0127817 A1 | 9/2002 | Heo et al. |
| 2003/0006476 A1 | 1/2003 | Chen et al. |
| 2003/0013271 A1 | 1/2003 | Knorr et al. |
| 2003/0052384 A1 | 3/2003 | Sato et al. |
| 2003/0143852 A1 | 7/2003 | En-Ho et al. |
| 2004/0072408 A1 | 4/2004 | Yun et al. |
| 2004/0192009 A1 | 9/2004 | Belyansky et al. |
| 2005/0287731 A1 | 12/2005 | Bian et al. |
| 2006/0255426 A1 | 11/2006 | Inoue et al. |

OTHER PUBLICATIONS

Sukesh Sandhu, "Method for Filling Shallow Isolation Trenches and Other Recesses During the Formation of a Semiconductor Device and Electronic Systems Including the Semiconductor Device," (24 pages including drawings) U.S. Appl. No. 11/371,680, filed Mar. 8, 2006.

ISOLATION TRENCHES FOR MEMORY DEVICES

RELATED APPLICATION

This application is a divisional of U.S. application Ser. No. 11/962,967, titled "ISOLATION TRENCHES FOR MEMORY DEVICES," filed Dec. 21, 2007 now U.S. Pat. No. 7,892,943 (allowed), which application is a continuation of U.S. application Ser. No. 10/878,805 of the same title, filed Jun. 28, 2004 and issued as U.S. Pat. No. 7,332,408 on Feb. 19, 2008, both of which applications are commonly assigned and incorporated herein by reference in their entirety.

TECHNICAL FIELD OF THE INVENTION

The present invention relates generally to memory devices and in particular the present invention relates to isolation trenches for memory devices.

BACKGROUND OF THE INVENTION

Memory devices are typically provided as internal storage areas in computers. The term memory identifies data storage that comes in the form of integrated circuit chips. In general, memory devices contain an array of memory cells for storing data, and row and column decoder circuits coupled to the array of memory cells for accessing the array of memory cells in response to an external address.

One type of memory is a non-volatile memory known as flash memory. A flash memory is a type of EEPROM (electrically-erasable programmable read-only memory) that can be erased and reprogrammed in blocks. Many modern personal computers (PCs) have their BIOS stored on a flash memory chip so that it can easily be updated if necessary. Such a BIOS is sometimes called a flash BIOS. Flash memory is also popular in wireless electronic devices because it enables the manufacturer to support new communication protocols as they become standardized and to provide the ability to remotely upgrade the device for enhanced features.

A typical flash memory comprises a memory array that includes a large number of memory cells arranged in row and column fashion. Each of the memory cells includes a floating-gate field-effect transistor capable of holding a charge. The cells are usually grouped into blocks. Each of the cells within a block can be electrically programmed on an individual basis by charging the floating gate. The charge can be removed from the floating gate by a block erase operation. The data in a cell is determined by the presence or absence of the charge on the floating gate.

Memory devices are typically formed on semiconductor substrates using semiconductor fabrication methods. The array of memory cells is disposed on the substrate. Isolation trenches formed in the substrate within the array and filled with a dielectric, e.g., shallow trench isolation (STI), provide voltage isolation on the memory array by acting to prevent extraneous current flow through the substrate between the memory cells. The isolation trenches are often filled using a physical deposition process, e.g., with high-density plasma (HDP) oxides. However, the spacing requirements for flash memory arrays often require the isolation trenches to have relatively narrow widths, resulting in large aspect (or trench-depth-to-trench-width) ratios. The large aspect ratios often cause voids to form within the dielectric while filling these trenches using physical sputtering processes.

Filling the trenches with spin-on-dielectrics (SODs) can reduce the formation of voids within the dielectric during filling. However, spin-on-dielectrics usually have to be cured (or annealed) after they are disposed within the trenches, e.g., using a steam-oxidation process that can result in unwanted oxidation of the substrate and of layers of the memory cells overlying the substrate. To protect against such oxidation, the trenches can be lined with a nitride liner prior to filling the trenches with a spin-on-dielectric. One problem with nitride liners is that they can store trapped charges that can adversely affect the reliability of the memory cells and thus the memory device.

For the reasons stated above, and for other reasons stated below which will become apparent to those skilled in the art upon reading and understanding the present specification, there is a need in the art for alternatives to existing trench-fill methods.

DETAILED DESCRIPTION

Figure 1:
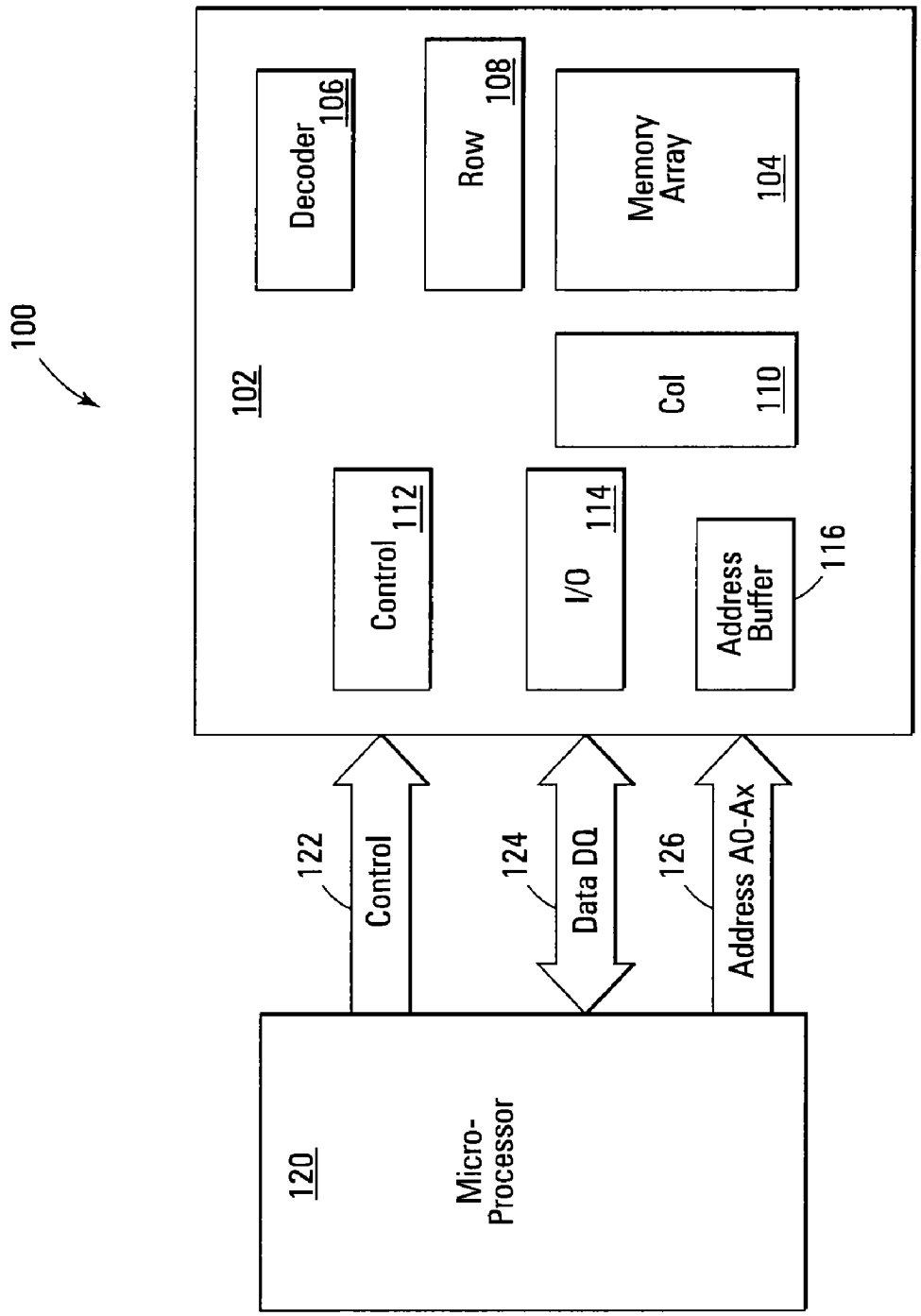
FIG. 1 is a simplified block diagram of a memory system, according to an embodiment of the invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The term wafer or substrate used in the following description includes any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions. The following detailed description is, therefore, not to be taken in a limiting sense, and the scope of the present invention is defined only by the appended claims and equivalents thereof.

FIG. 1 is a simplified block diagram of a memory system 100, according to an embodiment of the invention. Memory system 100 includes an integrated circuit memory device 102, such as a flash memory device, e.g., a NAND or NOR memory device, a DRAM, an SDRAM, etc., that includes an array of memory cells 104 and a region peripheral to memory array 104 that includes an address decoder 106, row access circuitry 108, column access circuitry 110, control circuitry 112, Input/Output (I/O) circuitry 114, and an address buffer 116. The row access circuitry 108 and column access circuitry 110 may include high-voltage circuitry, such as high-voltage pumps. Memory system 100 includes an external microprocessor 120, or memory controller, electrically connected to memory device 102 for memory accessing as part of an electronic system. The memory device 102 receives control signals from the processor 120 over a control link 122. The memory cells are used to store data that are accessed via a data (DQ) link 124. Address signals are received via an address link 126 that are decoded at address decoder 106 to access the memory array 104. Address buffer circuit 116 latches the address signals. The memory cells are accessed in response to the control signals and the address signals. It will be appreciated by those skilled in the art that additional circuitry and control signals can be provided, and that the memory device of FIG. 1 has been simplified to help focus on the invention.

The memory array 104 includes memory cells arranged in row and column fashion. For one embodiment, the memory cells are flash memory cells that include a floating-gate field-effect transistor capable of holding a charge. The cells may be grouped into blocks. Each of the cells within a block can be electrically programmed on an individual basis by charging the floating gate. The charge can be removed from the floating gate by a block erase operation.

For one embodiment, memory array 104 is a NOR flash memory array. A control gate of each memory cell of a row of the array is connected to a word line, and a drain region of each memory cell of a column of the array is connected to a bit line. The memory array for NOR flash memory devices is accessed by row access circuitry, such as the row access circuitry 108 of memory device 102, activating a row of floating gate memory cells by selecting the word line connected to their control gates. The row of selected memory cells then place their data values on the column bit lines by flowing a differing current, depending upon their programmed states, from a connected source line to the connected column bit lines.

For another embodiment, memory array 104 is a NAND flash memory array also arranged such that the control gate of each memory cell of a row of the array is connected to a word line. However, each memory cell is not directly connected to a column bit line by its drain region. Instead, the memory cells of the array are arranged together in strings (often termed NAND strings), e.g., of 32 each, with the memory cells connected together in series, source to drain, between a source line and a column bit line. The memory array for NAND flash memory devices is then accessed by row access circuitry, such as the row access circuitry 108 of memory device 102, activating a row of memory cells by selecting the word line connected to a control gate of a memory cell. In addition, the word lines connected to the control gates of unselected memory cells of each string are driven to operate the unselected memory cells of each string as pass transistors, so that they pass current in a manner that is unrestricted by their stored data values. Current then flows from the source line to the column bit line through each series connected string, restricted only by the selected memory cells of each string. This places the current-encoded data values of the row of selected memory cells on the column bit lines.

Figure 2A:
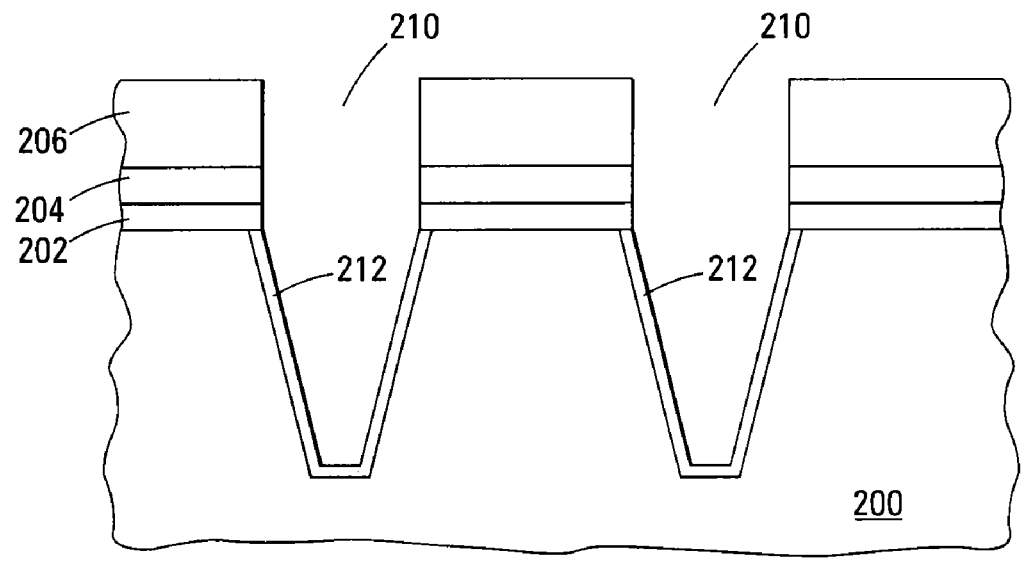
FIGS. 2A-2H are cross-sectional views of a portion of a memory device during various stages of fabrication, according to another embodiment of the invention.

FIGS. 2A-2H are cross-sectional views of a portion of a memory device, such as a portion of the memory device 102, during various stages of fabrication, according to another embodiment of the invention. FIG. 2A depicts the portion of the memory device after several processing steps have occurred. Formation of the structure depicted in FIG. 2A is well known and will not be detailed herein.

In general, the structure of FIG. 2A is formed by forming a first dielectric layer 202 on a substrate 200, e.g., of silicon or the like. For one embodiment, the first dielectric layer 202 is a gate dielectric layer (or tunnel dielectric layer), such as a tunnel oxide layer. A conductive layer 204, e.g., a layer of doped polysilicon, is formed on the first dielectric layer 202, and a hard mask layer 206 is formed on the conductive layer 204. The mask layer 206 can be a second dielectric layer, such as a nitride layer, e.g., a silicon nitride ($Si_3N_4$) layer.

Trenches 210 are subsequently formed through the mask layer 206, the conductive layer 204, and the first dielectric layer 202 and extend into substrate 200. This can be accomplished by patterning the mask layer 206 and etching. A third dielectric layer 212 may then be formed on portions of the substrate 200 exposed by the trenches 210 so as to line the portion of trenches 210 formed in substrate 200.

Figure 2B:
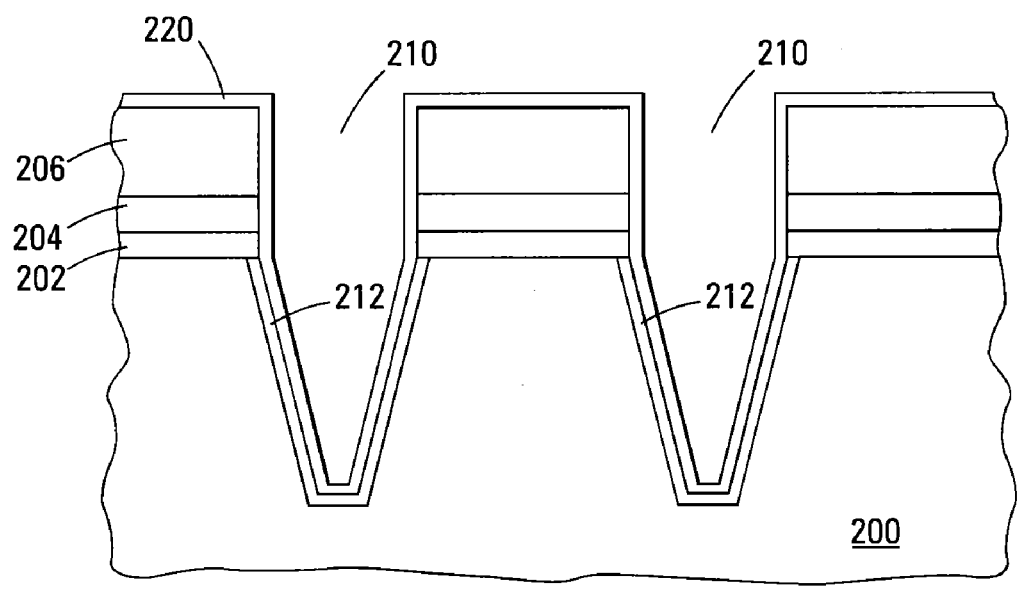

A fourth dielectric layer 220, such as a nitride layer, e.g., a silicon nitride layer, is formed on the structure of FIG. 2A in FIG. 2B, such as by blanket deposition, and acts as an oxidation barrier layer for one embodiment. Specifically, the fourth dielectric layer 220 is formed on an upper surface of mask layer 206 and on portions of the mask layer 206, the conductive layer 204, and the first dielectric layer 202 through which trenches 210 pass. The fourth dielectric layer 220 is also formed on the third dielectric layer 212. In this way, the fourth dielectric layer 220 lines trenches 210. For one embodiment, the third dielectric layer 212 acts to provide adhesion between substrate 200 and the fourth dielectric layer 220 and acts as a stress release layer for relieving stresses that would otherwise form between substrate 200 and the fourth dielectric layer 220. For another embodiment, the third dielectric layer 212 is a pad oxide layer and can be a thermal oxide layer. For another embodiment, the third dielectric layer 212 is, for example, of deposited silicon dioxide ($SiO_2$).

Figure 2C:
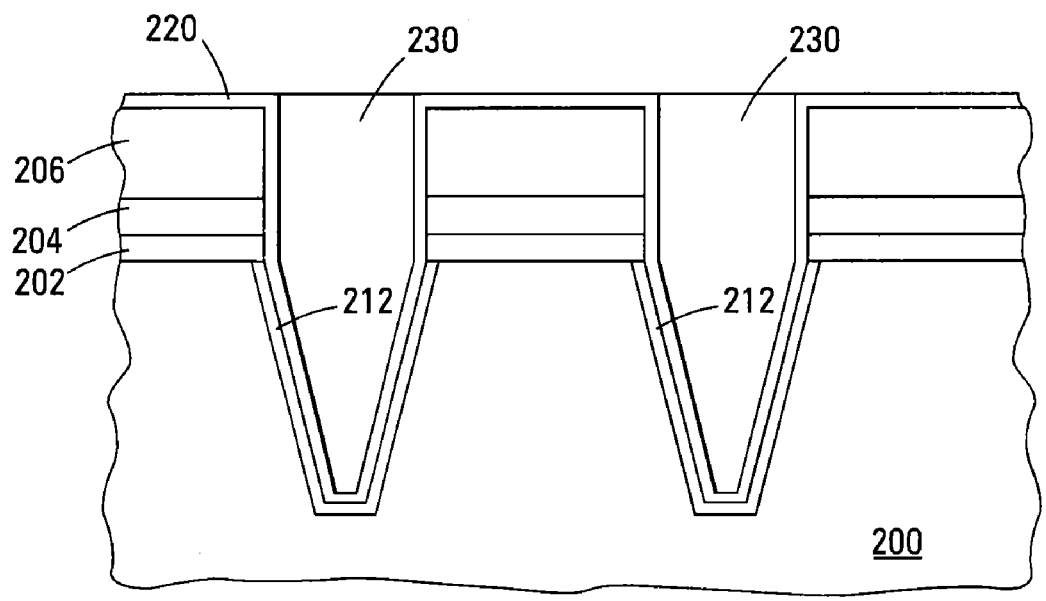
Figure 2D:
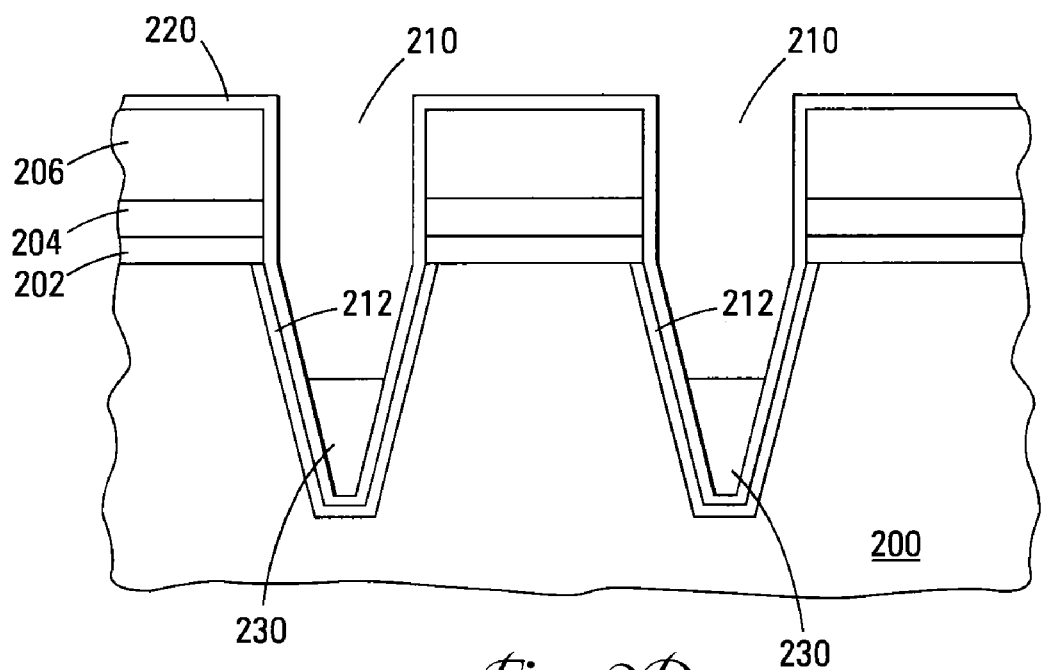

A fifth dielectric layer 230 is deposited within each of the trenches 210 on the fourth dielectric layer 220 in FIG. 2C to either fill or partially fill trenches 210. For one embodiment, the fifth dielectric layer 230 is spin-on dielectric (SOD) material 230, such as a spin-on glass, hydrogen silsesquioxane (HSQ), hexamethyldisiloxane, octamethyltrisiloxane, etc. The fifth dielectric layer 230 is then cured (or annealed), e.g., using a steam-oxidation process, if necessary. For one embodiment, the fourth dielectric layer 220 acts to prevent oxidation of the substrate 200 and the conductive layer 204 during curing. In FIG. 2D, a portion of the fifth dielectric layer 230 is removed, such as by etching in an etch-back process, so that an upper surface of the fifth dielectric layer 230 is recessed within the respective trenches 210, e.g., below an upper surface of substrate 200, exposing a portion of the fourth dielectric layer 220 lining each of trenches 210.

Figure 2E:
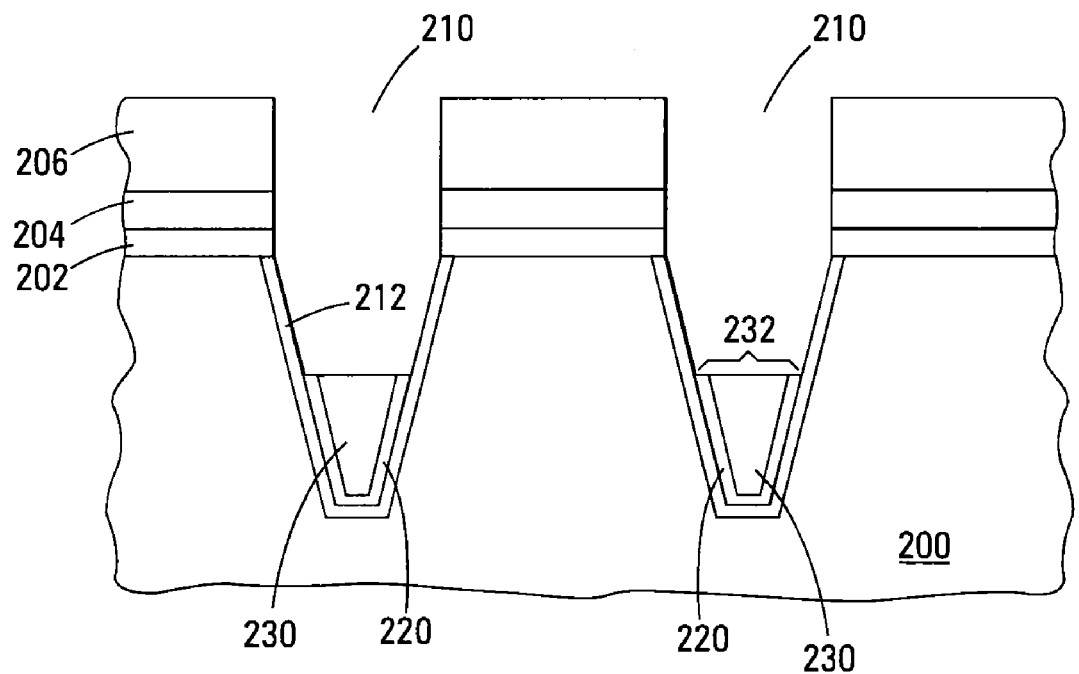

A portion of the fourth dielectric layer 220 is selectively removed in FIG. 2E, e.g., using a controlled wet etch, to a level of the upper surface of the fifth dielectric layer 230 such that a remaining portion of the fourth dielectric layer 220 is interposed between the fifth dielectric layer 230 and the third dielectric layer 212. That is, the fourth dielectric layer 220 is removed from an upper surface of the mask layer 206, and the exposed portion of the fourth dielectric layer 220 located within each of trenches 210 is removed. This exposes the upper surface of the mask layer 206, the portions of the mask layer 206, the conductive layer 204, and the first dielectric layer 202 through which trenches 210 pass, and a portion of the third dielectric layer 212 lying between the upper surface of substrate 200 and the upper surface of the fifth dielectric layer. The remaining portions of the fourth dielectric layer 220 and the fifth dielectric layer 230 form a first dielectric plug 232 that fills a lower portion of trenches 210, as shown in FIG. 2E, having an upper surface that is recessed below the upper surface of the substrate 200.

Figure 2F:
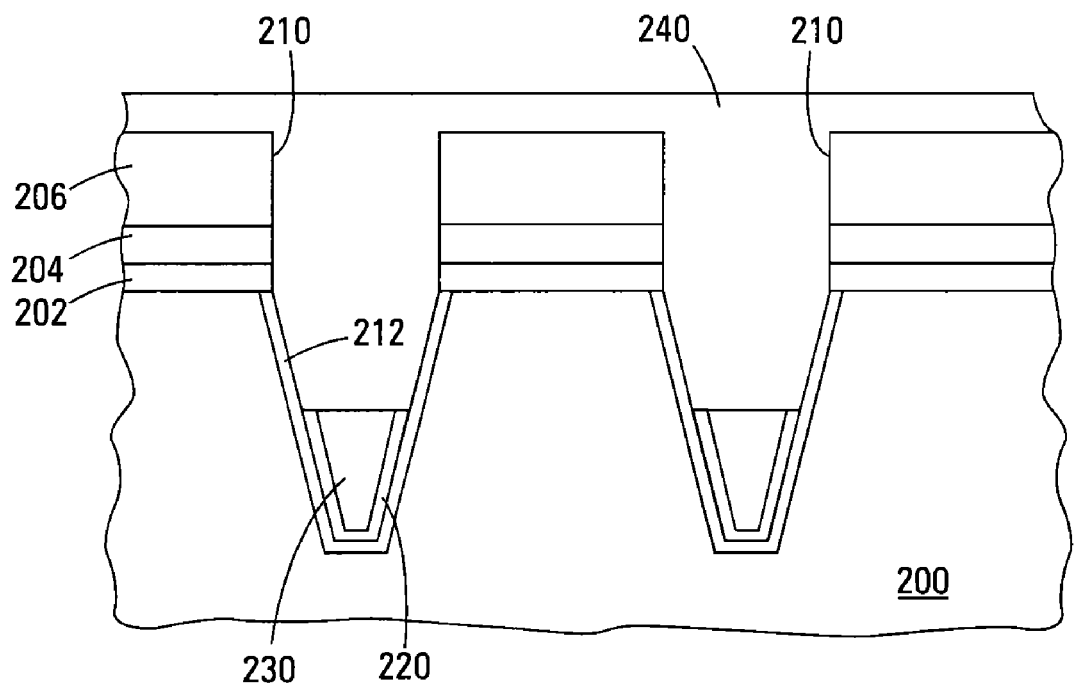

In FIG. 2F, a sixth dielectric layer 240 is blanket deposited, e.g., using a physical sputtering process, over the structure of FIG. 2E and fills an unfilled portion of each of trenches 210. Specifically, the sixth dielectric layer 240 is deposited on the exposed upper surface of the mask layer 206, on the exposed portions of the mask layer 206, the conductive layer 204, and the first dielectric layer 202 through which trenches 210 pass, on the portion of the third dielectric layer 212 lying between the upper surface of substrate 200 and the upper surface of the fifth dielectric layer, and on the first dielectric plug 232. For one embodiment, the sixth dielectric layer 240 is of a high-density-plasma (HDP) dielectric material, such as a high-density-plasma (HDP) oxide. Note that the first dielectric plugs 232 reduce the remaining depths of trenches 210 and thus their aspect ratios for the deposition of the sixth dielectric layer 240. The reduced aspect ratios of trenches 210 act to reduce the formation of voids when depositing the sixth dielectric layer 240 within the unfilled portions of trenches 210.

Figure 2G:
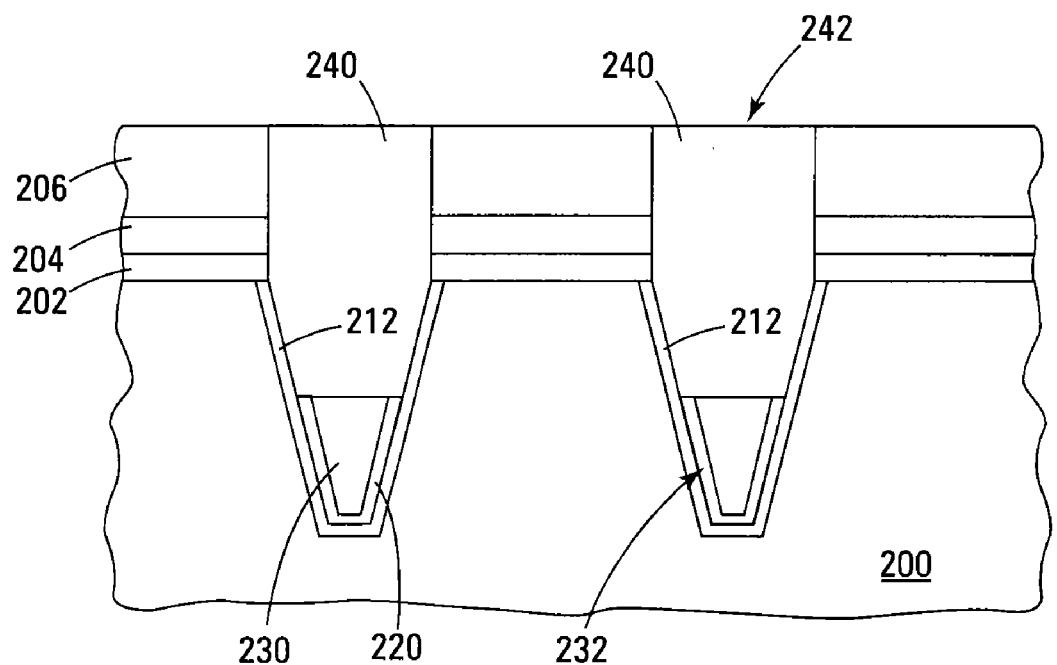

A portion of the sixth dielectric layer 240 is removed from the structure of FIG. 2F in FIG. 2G, e.g., using chemical mechanical polishing (CMP). That is, the sixth dielectric layer 240 is removed so that the upper surface of the mask layer 206 is exposed and so that an upper surface of the sixth dielectric layer 240 within each of trenches 210 is substantially flush with the upper surface of the mask layer 206. Note that the portion of the sixth dielectric layer 240 within each of the trenches 210 forms a second dielectric plug 242 that passes through the mask layer 206, the conductive layer 204, and the first dielectric layer 202, extends into the substrate 200, and terminates at the first conductive plug 232. The third dielectric layer 212 is interposed between the portion of the second dielectric plug 242 and the substrate 200 and the first dielectric plug 232 and the substrate 200.

Note that the fourth dielectric layer 220 is located in the lower portion of each of trenches 210 and thus away from the layers disposed on the upper surface of substrate 200 that can be used to form memory cells. This acts to reduce problems associated with the fourth dielectric layer 220 storing trapped charges, especially when the fourth dielectric layer 220 is of nitride, that can adversely affect the reliability of the memory cells and thus the memory device.

Figure 2H:
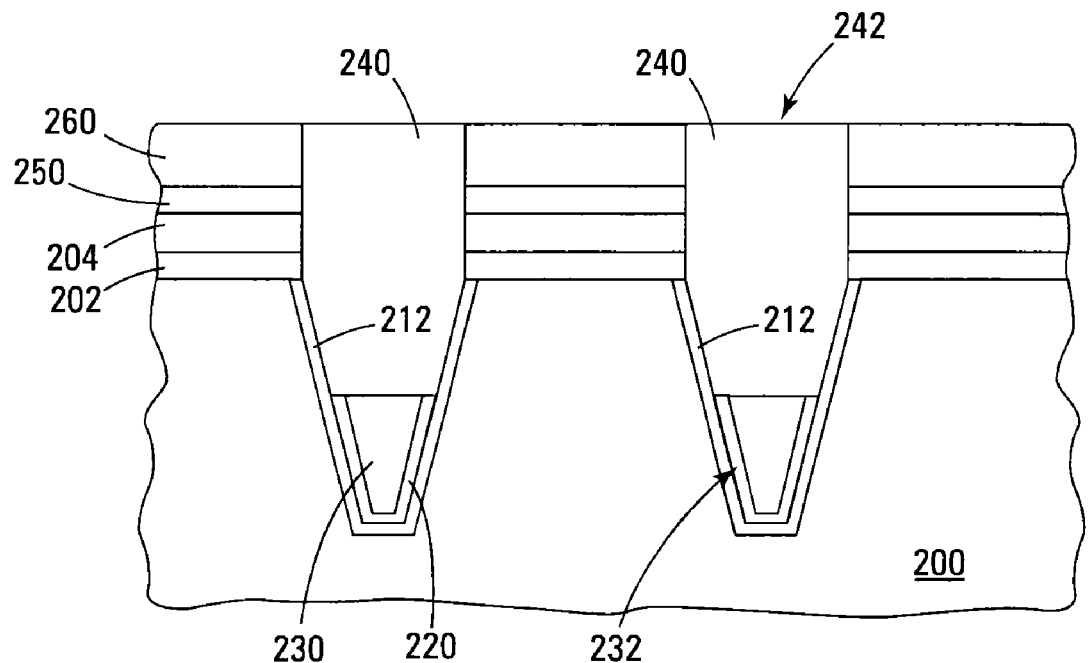

Mask 206 is subsequently removed to expose the conductive layer 204. An intergate dielectric layer 250, e.g., such as a layer of silicon oxide, a nitride, an oxynitride, an oxide-nitride-oxide (ONO) layer, etc., is then formed on the exposed conductive layer 204. A conductive layer 260, such as a doped polysilicon layer, a metal layer, e.g., refractory metal layer, a metal containing layer, e.g., a metal silicide layer, or the like, is formed on the intergate dielectric layer 250, as shown in FIG. 2H. The conductive layer 260 may include one or more conductive materials or conductive layers, a metal or metal containing layer disposed on a polysilicon layer, etc. For another embodiment, conductive layers 204 and 260 respectively form a floating gate and a control gate (or word line) of memory cells of a memory array, such as memory array 104 of FIG. 1. Source/drain regions are also formed in a portion of substrate 200 not shown in FIG. 2G as a part of the memory array. For one embodiment, conductive layer 204 is extended to improve the coupling of the floating gate. The trenches 210 filled with dielectric materials, as described above, act to prevent extraneous current flow through the substrate between the memory cells.

The components located in the region peripheral to memory array 104 of FIG. 1 are also formed on the substrate 200, and the trenches 210 filled with dielectric materials, as described above, may be formed between the region peripheral to memory array 104 and memory array 104 and act to prevent extraneous current flow through the substrate between components of the peripheral region and memory array 104.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. An integrated circuit device, comprising:
a first dielectric plug formed in a substrate so that an upper surface of the first dielectric plug is located below an upper surface of the substrate, the first dielectric plug comprising a layer of first dielectric material formed on a layer of second dielectric material;
a second dielectric plug of a third dielectric material formed on the upper surface of the first dielectric plug and extending through a layer of fourth dielectric material formed overlying the upper surface of the substrate and a conductive layer formed overlying the layer of fourth dielectric material, wherein the second dielectric plug contacts a portion of the layer of fourth dielectric material and the conductive layer;
a layer of fifth dielectric material overlying the conductive layer; and
an other conductive layer overlying the layer of fifth dielectric material;
wherein an upper surface of the fifth dielectric material is located at a depth below an upper surface of the second dielectric plug.

2. An integrated circuit device comprising:
a trench having a first portion that extends into a substrate below an upper surface of the substrate and a second portion that passes through a tunnel dielectric layer disposed on the upper surface of the substrate and a floating gate layer disposed on the tunnel dielectric layer;
a layer of first dielectric material lining the first portion of the trench;
a first dielectric plug partially filling the first portion of the trench, the first dielectric plug comprising a layer of second dielectric material formed on the layer of first dielectric material lining the first portion of the trench and a layer of third dielectric material formed on the layer of second dielectric material;
a second dielectric plug of a fourth dielectric material filling a remaining portion of the first portion of the trench and disposed on the layer of first dielectric material lining the first portion of the trench, disposed on an upper surface of the first dielectric plug, and filling the second portion of the trench so as to contact the tunnel dielectric layer and the floating gate layer;
an intergate dielectric layer overlying the floating gate layer; and
a control gate overlying the intergate dielectric layer;
wherein an upper surface of the intergate dielectric layer is located at a depth below an upper surface of the second dielectric plug.

3. The integrated circuit device of claim 2, wherein the layer of first dielectric material is in direct contact with the substrate and is in direct contact with the layer of second dielectric material.

4. An integrated circuit device comprising:
a trench having a first portion that extends into a substrate below an upper surface of the substrate and a second portion that passes through a tunnel dielectric layer disposed on the upper surface of the substrate and a floating gate layer disposed on the tunnel dielectric layer;
a layer of first dielectric material lining the first portion of the trench;
a first dielectric plug partially filling the first portion of the trench, the first dielectric plug comprising a layer of second dielectric material formed on the layer of first dielectric material lining the first portion of the trench and a layer of third dielectric material formed on the layer of second dielectric material;
a second dielectric plug of a fourth dielectric material filling a remaining portion of the first portion of the trench and disposed on the layer of first dielectric material lining the first portion of the trench, disposed on an upper surface of the first dielectric plug, and filling the second portion of the trench so as to contact the tunnel dielectric layer and the floating gate layer;
an intergate dielectric layer overlying the floating gate layer; and
a control gate overlying the intergate dielectric layer;
wherein the upper surface of the first dielectric plug comprises an upper surface of the layer of the third dielectric material and a portion of the layer of the second dielectric material coplanar with the upper surface of the layer of the third dielectric material; and
wherein an upper surface of the intergate dielectric layer is located at a depth below an upper surface of the second dielectric plug.

5. The integrated circuit device of claim 4, wherein the second dielectric plug contacts the intergate dielectric layer and the control gate.

6. An integrated circuit device, comprising:
a first dielectric plug formed in a substrate so that an upper surface of the first dielectric plug is located below an upper surface of the substrate, the first dielectric plug comprising a layer of first dielectric material formed on a layer of second dielectric material;
a second dielectric plug of a third dielectric material formed on the upper surface of the first dielectric plug and extending through a layer of fourth dielectric material formed overlying the upper surface of the substrate and a conductive layer formed overlying the layer of fourth dielectric material, wherein the second dielectric plug contacts a portion of the layer of fourth dielectric material and the conductive layer;
a layer of fifth dielectric material overlying the conductive layer; and
an other conductive layer overlying the layer of fifth dielectric material;
wherein the upper surface of the first dielectric plug comprises an upper surface of the layer of the first dielectric material and a portion of the layer of the second dielectric material coplanar with the upper surface of the layer of the first dielectric material; and wherein an upper surface of the fifth dielectric material is located at a depth below an upper surface of the second dielectric plug.

7. The integrated circuit device of claim 1, wherein the second dielectric plug contacts a portion of the fifth dielectric material and a portion of the other conductive layer.

8. The integrated circuit device of claim 1, further comprising a layer of sixth dielectric material interposed between the substrate and the layer of second dielectric material of the first dielectric plug and interposed between a portion of the second dielectric plug and the substrate.

9. The integrated circuit device of claim 8, wherein the layer of sixth dielectric material is in direct contact with the substrate and is in direct contact with the layer of second dielectric material.

10. The integrated circuit device of claim 1, wherein the second dielectric material is a nitride, the first dielectric material is a spin-on dielectric, and the third dielectric material is a high-density-plasma material.

11. The integrated circuit device of claim 10, wherein the spin-on dielectric is annealed.

* * * * *

UNITED STATES PATENT AND TRADEMARK OFFICE
CERTIFICATE OF CORRECTION

| | | |
|---|---|---|
| PATENT NO. | : 8,049,298 B2 | |
| APPLICATION NO. | : 12/891248 | |
| DATED | : November 1, 2011 | |
| INVENTOR(S) | : Michael Violette | |

It is certified that error appears in the above-identified patent and that said Letters Patent is hereby corrected as shown below:

In column 8, line 21, in Claim 7, delete "claim 1" and insert -- claim 6 --, therefor.

In column 8, line 24, in Claim 8, delete "claim 1" and insert -- claim 6 --, therefor.

In column 8, line 33, in Claim 10, delete "claim 1" and insert -- claim 6 --, therefor.

Signed and Sealed this
Third Day of January, 2012

David J. Kappos
*Director of the United States Patent and Trademark Office*